United States Patent
Bhandari

(10) Patent No.: US 7,465,421 B2
(45) Date of Patent: Dec. 16, 2008

(54) PROCESS OF PREPARATION OF SYNTHETIC FIRE OPAL

(76) Inventor: Rajneesh Bhandari, # S 271, Mahaveer Nagar, Jaipur-203018 (IN)

( * ) Notice: Subject to any disclaimer, the term of this patent is extended or adjusted under 35 U.S.C. 154(b) by 0 days.

(21) Appl. No.: 10/967,589

(22) Filed: Oct. 18, 2004

(65) Prior Publication Data

US 2006/0084563 A1   Apr. 20, 2006

(51) Int. Cl.
*C30B 29/16* (2006.01)
(52) U.S. Cl. .................................. 264/621; 264/910
(58) Field of Classification Search ................ 264/910, 264/621; 501/12, 32; 65/17.2
See application file for complete search history.

(56) References Cited

U.S. PATENT DOCUMENTS

| | | | |
|---|---|---|---|
| 2,699,706 A * | 1/1955 | Boone | 359/498 |
| 4,430,257 A * | 2/1984 | Pope et al. | 588/12 |
| 4,703,020 A | 10/1987 | Nakano et al. | |
| 5,637,507 A * | 6/1997 | Wicks et al. | 436/166 |
| 6,696,258 B1 * | 2/2004 | Wei et al. | 435/7.2 |
| 2002/0062782 A1 * | 5/2002 | Norris et al. | 117/3 |
| 2003/0012942 A1 * | 1/2003 | Larsen et al. | 428/304.4 |
| 2004/0121451 A1 * | 6/2004 | Moritz et al. | 435/287.2 |

FOREIGN PATENT DOCUMENTS

| JP | 2003073170 A2 | 3/2003 |
|---|---|---|
| WO | WO2004024627 A1 | 3/2004 |

OTHER PUBLICATIONS

"Inverse Opals Photonic Crystals—A laboratory Guide"; Schroden and Balakrishnan; Univ. of Minnesota, Materials Science Research and Engineering Center, 2001, pp. 1-31.

* cited by examiner

*Primary Examiner*—Carlos Lopez
(74) *Attorney, Agent, or Firm*—Lawrence Edelman

(57) ABSTRACT

A synthetic fire opal and a process for its preparation. Synthetic fire opals have similar physical and chemical properties as natural fire opals. Synthetic fire opals are colored, hard, and transparent. The process of preparation of synthetic fire opal includes; mixing TEOS with absolute ethanol (99.9%), distilled water, concentrated nitric acid, and an inorganic salt to form a clear sol, storing the clear sol to obtain a gel, drying the gel and sintering the dried gel to obtain a synthetic fire opal.

20 Claims, 4 Drawing Sheets

PROCESS OF PREPARATION OF SYNTHETIC FIRE OPAL

BACKGROUND

The present invention relates to the field of synthetic gemstones. More specifically, it relates to a method of preparation of a synthetic fire opal that has similar physical and chemical properties as a natural fire opal.

Natural opal is a gemstone made of hydrated amorphous silica (chemical formula $SiO_2 \cdot nH_2O$). Based on visual appearance, natural opals can be classified as precious opals, common opals, and fire opals. Precious opals exhibit a 'play-of-color'. Play-of-color is the phenomenon of changing spectral hues produced by the diffraction of white light through a microstructure of orderly arrayed silica spheres. Common opals have high opacity and do not exhibit the play-of-color. Fire opals are transparent or translucent opals with an orange or red body color.

Natural fire opal is an opal that has been mined from the earth and may be treated in a number of ways to enhance its qualities. Natural fire opals are rare and expensive. Also, in natural opals, there is a lot of variation in color from piece to piece. Natural fire opals have long been used as ornamental stones in jewelry. However, natural fire opals are brittle and heat sensitive. Most natural fire opals also show crazing. Crazing is the phenomenon of developing cracks in the opal with the passage of time or when the fire opal is subjected to heating.

Simulants of natural opals exist in the market. These simulants are used as alternatives for natural opals. Simulants are artificial stones that resemble the natural opal, but their chemical composition and physical properties are not the same as natural opals. Synthetic opals have the same chemical composition and physical properties as natural opals. Scientists have been able to produce synthetic opals in laboratory conditions.

A paper titled 'Some Aspects of Precious Opal Synthesis', by S. V. Filin, A. I. Puzynin, and V. N. Samoilov, published in 'Australian Gemmologist', Vol. 21, No. 7, 2002, pp. 278-282, describes one such method of preparation of synthetic opals. The paper describes the synthesis of an opal by a multi-step process. In the first stage of the process, synthesis of monodisperse particles of silica of about 300 nm size is carried out by the hydrolysis of tetraethyl ester of orthosilicic acid, $Si(OC_2H_5)_4$ in ethanol. In the second stage, the raw precursor of opal is precipitated by spontaneous sedimentation. The sedimentation time is about seven months. In the third stage, the precursor opal is dried by a method of supercritical drying in an autoclave to obtain samples of any dimension within a time span of 10-12 hours. This is followed by sintering in a furnace at temperatures of 600° C., 800° C., and 1000° C. The total time involved in the synthesis of a synthetic opal is 10 months.

U.S. Pat. No. 4,703,020, titled 'Process for the Production of Jewelling and Ornamental Material', assigned to Kyocera Corporation, Kyoto, Japan, describes another such method of production of synthetic opal. This patent describes a process of production of a jewelling and ornamental material which produces a play-of-color similar to a natural opal. The main raw material used is amorphous silica spheres with a particle diameter within the range of 0.15 to 0.4 microns. The mixture of amorphous silica spheres and water is subjected to sedimentation for several weeks to several months. The resulting jelly-like precipitate is spontaneously dried, and then calcined to a temperature of about 800° C. to form a structure composed of regularly three-dimensionally arranged amorphous silica spheres. Zirconium alkoxide, in the form of a solution, is impregnated in the three-dimensional structure. The entire structure is then calcined at a temperature of about 1150° C. for about 30 hours to obtain a jewelling and ornamental material.

The above-mentioned methods of preparation of synthetic opals depend upon the three-dimensional arrangement of amorphous silica spheres to produce play-of-color. Therefore, such methods may not be applied for the preparation of synthetic fire opals without play-of-color. In addition, such methods may not lead to the production of synthetic fire opals in different colors. Another limitation is the time taken by each of these processes. The entire process in the existing methods of preparation of synthetic opals takes about 7-10 months. Further, they also require production of amorphous silica spheres with particle diameter in the specified range, as the first step in the process of preparation of a synthetic opal.

It is therefore evident that there is a need for a process of preparation of synthetic fire opals. The process should produce synthetic fire opals with color uniformity. The process should be less time consuming and should lead to the preparation of synthetic fire opals in different colors. Further, the process should produce synthetic fire opals, not limited by the particle size of the raw material.

SUMMARY

It is an object of the invention to provide a process for the preparation of a synthetic fire opal for use in jewelry and ornaments.

The disclosed method involves the following steps: Absolute ethanol (99.9%), concentrated nitric acid, distilled water, and an inorganic salt are mixed in a closed container at room temperature and atmospheric pressure. Then, the mixture is vigorously stirred for 1 to 10 hours by using a magnetic stirrer to obtain a homogeneous reaction mixture. Thereafter, Tetraethylorthosilicate (TEOS) is carefully added to the homogeneous reaction mixture to obtain a clear sol. The clear sol is stored at room temperature for 5 to 10 days to obtain a wet gel. The wet gel is dried at temperatures ranging from 50° C. to 100° C. to obtain a colored and transparent material. Subsequently, the dried gel is further heat treated at temperatures ranging from 250° C. to 800° C. to obtain a colored, transparent, and hard synthetic fire opal.

The synthetic fire opal has the same physical and chemical properties as that of a natural fire opal. The synthetic fire opal is characterized by a hardness of 5.5 to 6.5 on the Mho scale, at least two percent of water content, refractive index of 1.37 to 1.47, and specific gravity of 1.96 to 2.20. Further, the synthetic fire opal may be of any color, for example, orange, pink, red, green, yellow, blue and the like. The synthetic opal may also be colorless.

In accordance with one embodiment of the invention, the process of preparation of synthetic fire opal takes about 4 to 6 weeks, which is substantially less in comparison to already known processes of synthetic opal production. Further, in the present invention, the process of preparation of synthetic fire opal is not affected by the particle size of the raw material. There is no requirement for uniform size particles of silica in this method. The present invention leads to the preparation of synthetic fire opal with color uniformity. Further, the synthetic fire opal so prepared may be of any color, i.e., orange, pink, red, green, yellow, blue and the like. The synthetic fire opal may also be colorless. The synthetic fire opal is hard and transparent. The synthetic fire opal is more stable than natural fire opal and does not show crazing. The synthetic fire opal can be used to make beads, cabochons, cut stones, or other shapes that can be used in various types of jewelry and ornaments.

BRIEF DESCRIPTION OF THE DRAWINGS

Various embodiments of the invention will hereinafter be described in conjunction with the appended drawings provided to illustrate and not to limit the invention, wherein like designations denote like elements, and in which.

DESCRIPTION OF EMBODIMENTS

Figure 1:
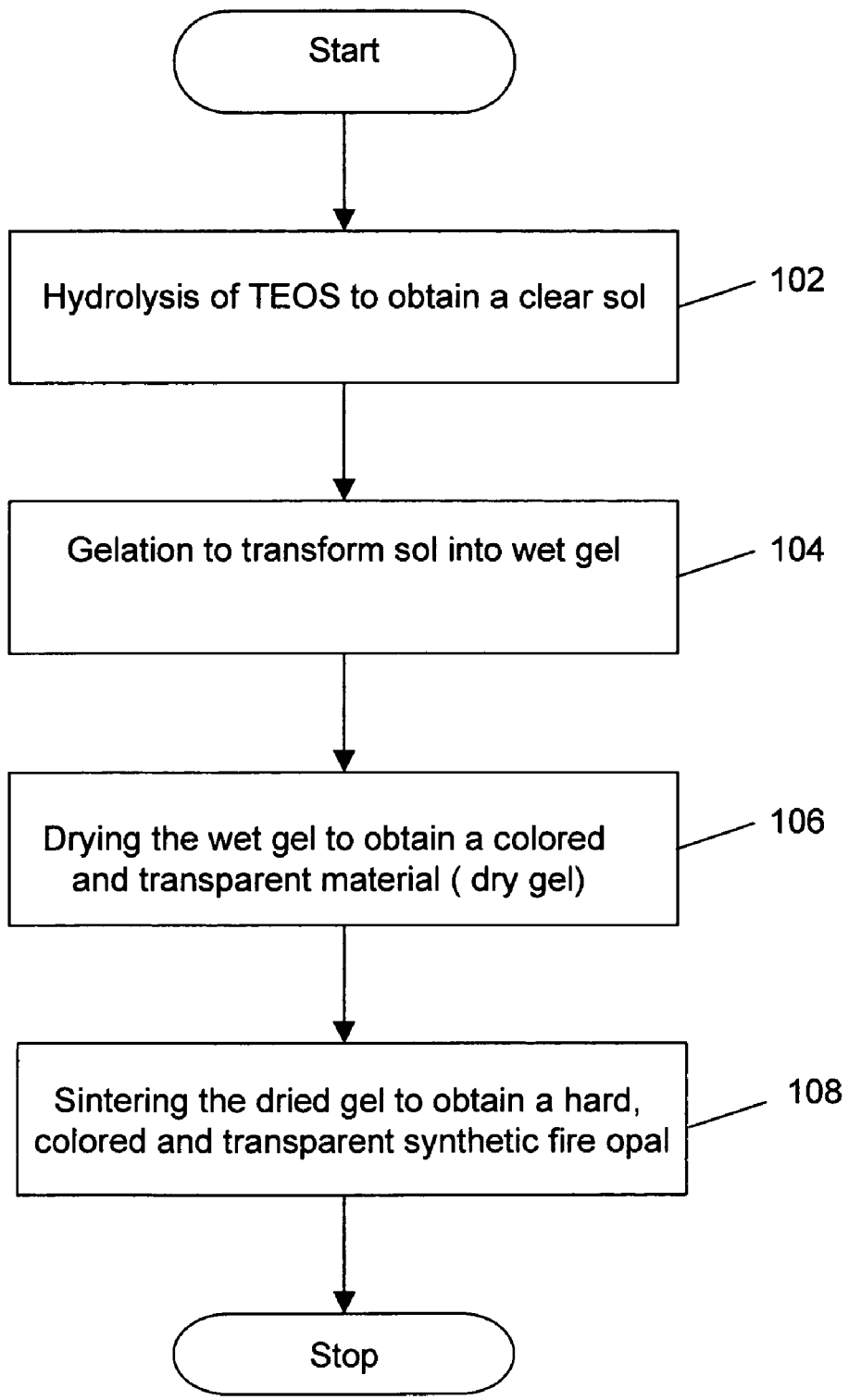
FIG. 1 is a flowchart illustrating the process of preparation of a synthetic fire opal for use in jewelry and ornaments, in accordance with an embodiment of the present invention.

For the sake of convenience, the terms used to describe various embodiments are defined below. It should be understood that these are provided to merely aid the understanding of the description, and that definitions in no way limit the scope of the invention.

Hydrolysis: The chemical reaction between water and a compound, usually a salt. The hydroxyl from the water combines with a cation from the compound and the hydrogen ion from the water combines with as anion from the compound.

Sol: A colloid that has a continuous liquid phase in which a solid is suspended in a liquid.

Gel: A colloidal dispersion that shows some rigidity and will keep the shape of the container in which it has been placed.

Gelation: The formation of a solid material from the modification or destabilization of a liquid. Gels have varying degrees of hardness depending on the solid concentration of the mass.

Drying: Removing of water (90-95%) or organic solvent from a material, by exposure to air, heating, or adding a chemical drying agent.

Sintering: The heating of a mass of fine particles (e.g., lead concentrates) below the melting point, causing agglomeration to form larger particles.

Synthetic fire opal: Synthetic fire opal is a material with essentially the same chemical composition and physical structure as natural opals but has been made in a laboratory or through an industrial process.

Synthetic fire opals are also referred as created fire opals.

The present invention describes a synthetic fire opal for use in jewelry and ornaments and a process for preparation thereof.

In accordance with one embodiment of the invention, the main raw materials used for the preparation of the synthetic fire opal are a precursor for silicon, a catalyst, a solvent and at least one inorganic salt. TEOS is used as a precursor for silicon. It will be apparent to a person skilled in the art that tetramethylorthosilicate (TMOS), tetramethoxysilane (TMS), tetraethoxysilane (TES) and the like may also be used as precursors for silicon instead of TEOS. TEOS undergoes hydrolysis and condensation reaction to form soluble metal hydroxides, which ultimately leads to the formation of continuous (—Si—O—Si—) linkages in an inorganic network that spans throughout the solvent medium. Absolute ethanol of 99.9% purity is used as a solvent in the process. Distilled water is required for hydrolysis of TEOS in the process. Concentrated nitric acid is used as a catalyst in the process. The assay concentration of nitric acid is 68 to 72%. It will be apparent to a person skilled in the art that other catalysts like HCl, ammonia, and glacial acetic acid etc., may also be used as catalysts without deviating from the scope of the present invention. Various inorganic salts of copper, cobalt, nickel, and iron are used as dopants to obtain synthetic fire opal of different colors. For example, salt of iron may be used to obtain an orange synthetic fire opal; salt of cobalt may be used to obtain a pink synthetic fire opal; another salt of cobalt may be used to obtain a red synthetic fire opal; salt of nickel may be used to obtain a green synthetic fire opal; salt of iron may be used to obtain a yellow synthetic fire opal; and salt of copper may be used to obtain a blue synthetic fire opal. It will be apparent to a person skilled in the art that it is a cation in the inorganic salt that is responsible for the color of synthetic fire opals. The inorganic salts in the present invention may have any anion, i.e., nitrate, chlorate, carbonate, sulphate, and the like.

FIG. 1 is a flowchart illustrating the process of preparation of a synthetic fire opal for use in jewelry and ornaments in accordance with an embodiment of the present invention. At step 102, hydrolysis of TEOS is carried out in a closed container at room temperature and atmospheric pressure to obtain a clear sol. This step is described in detail in conjunction with FIG. 2. At step 104, the clear sol obtained at step 102 is stored at room temperature in a closed cupboard for a period of 5 to 10 days and is transformed into wet gel. At step 106, the wet gel obtained at step 104 is dried at temperatures ranging from 50° C. to 100° C. to obtain a colored and transparent material. In an embodiment of the present invention the colored and transparent material is a dry gel. This step is described in detail in conjunction with FIG. 3. At step 108, the colored and transparent material obtained at step 106 is sintered, i.e., further heat treated, at temperatures ranging from 250° C. to 800° C. to obtain a colored, hard, and transparent synthetic fire opal. This step is described in detail in conjunction with FIG. 4.

Figure 2:
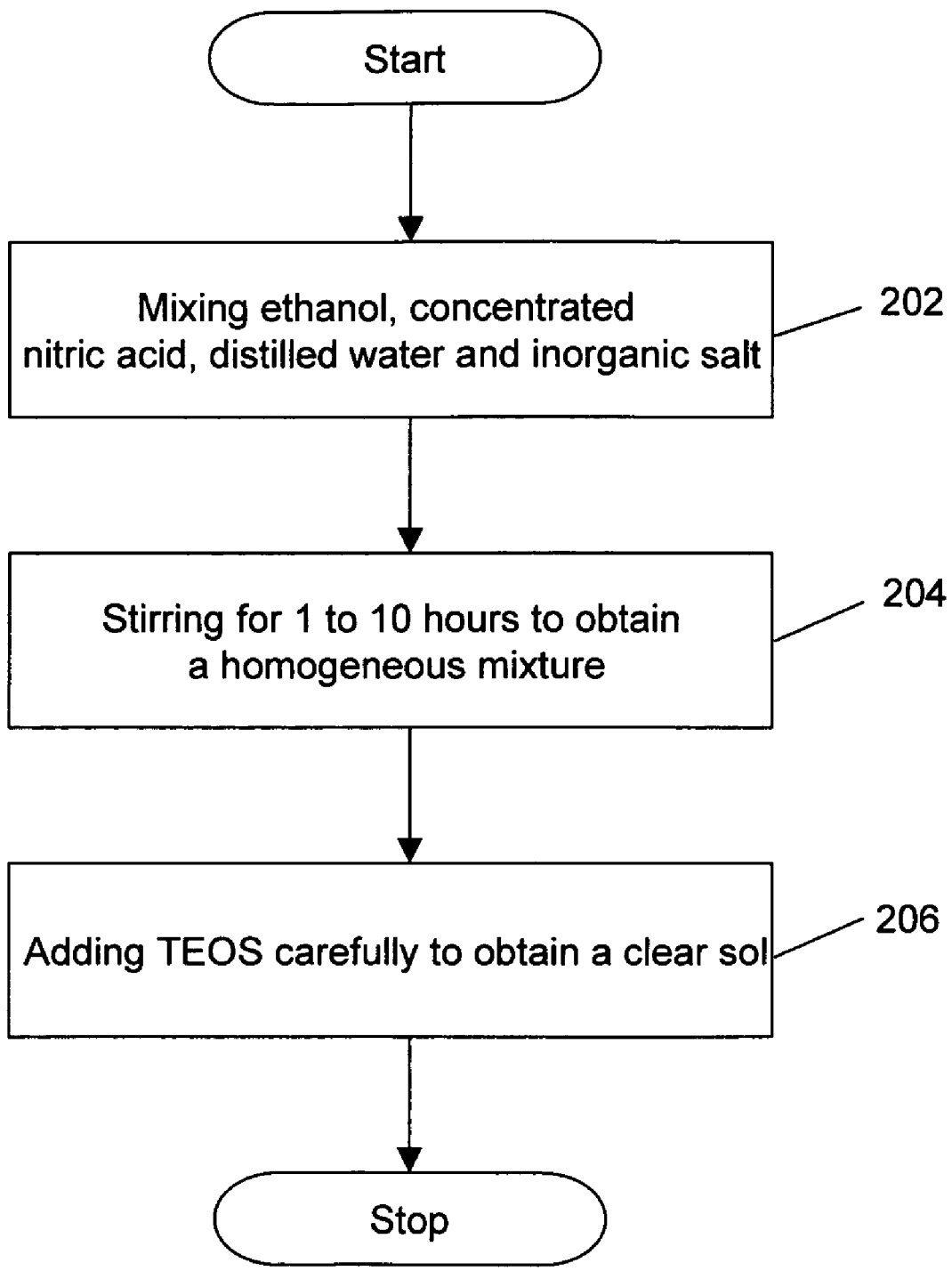
FIG. 2 is a flowchart illustrating the process of hydrolysis of TEOS to obtain a clear sol, in accordance with an embodiment of the present invention.

FIG. 2 is a flowchart illustrating the steps involved in mixing of raw materials to obtain a clear sol in accordance with an embodiment of the present invention. At step 202, absolute ethanol (99.9%), distilled water, concentrated nitric acid, and at least one inorganic salt (selected in accordance with the desired final color as described above) are mixed in a closed container at room temperature and atmospheric pressure. At step 204, the mixture of step 202 is vigorously stirred for 1 to 10 hours by using a magnetic stirrer to obtain a homogeneous reaction mixture. At step 206, TEOS is carefully added to the homogeneous reaction mixture of step 204 to obtain a clear sol. The mixing and stirring, as described above, results in the hydrolysis of TEOS.

The clear sol obtained after the hydrolysis of TEOS is stored at room temperature. In an embodiment of the present invention the clear sol is stored in a closed cupboard for a period of 5 to 10 days. After 5 to 10 days, the clear sol is transformed into wet gel, which is used for further processing.

Figure 3:
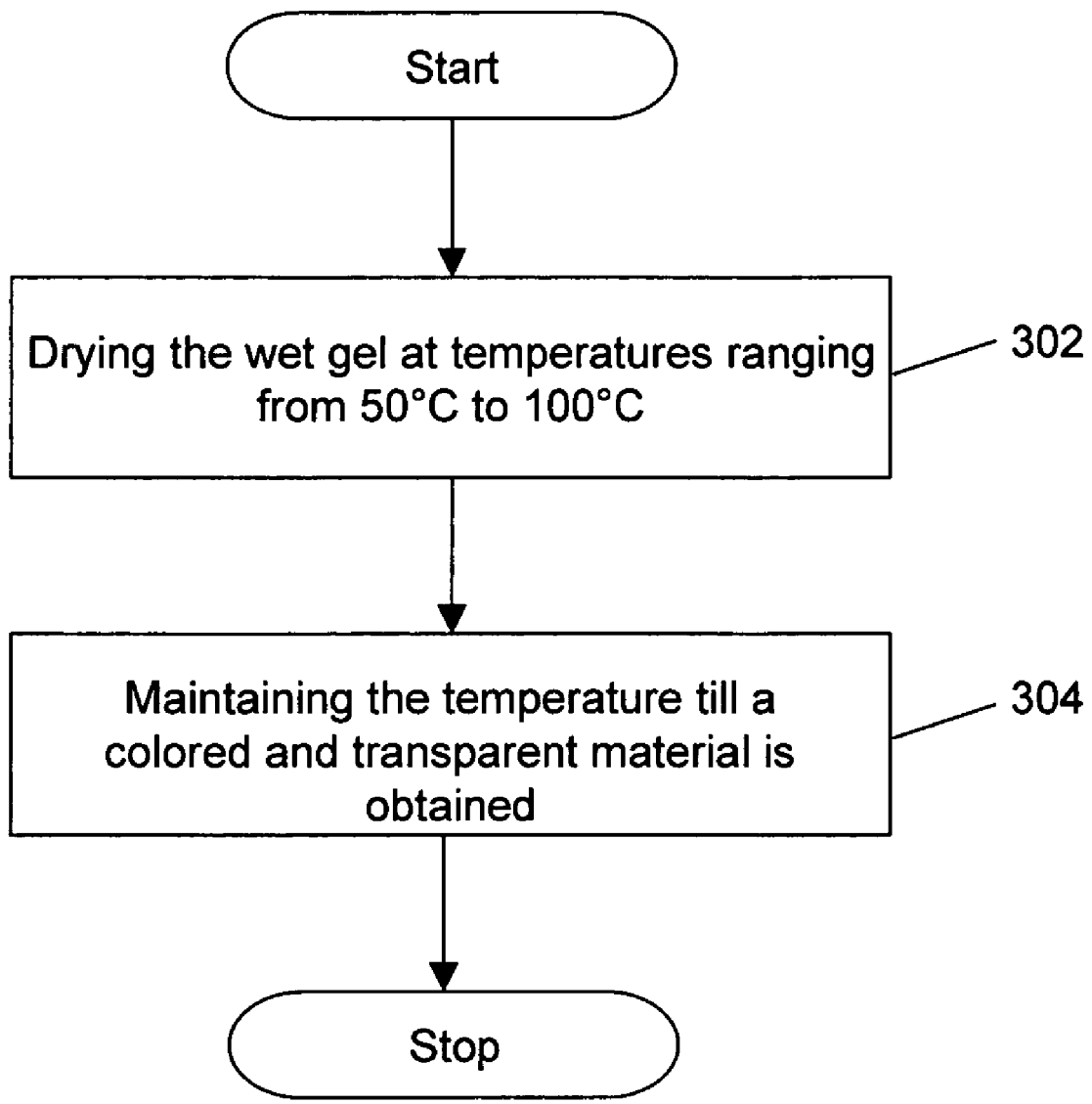
FIG. 3 is a flowchart illustrating the process of drying a wet gel to obtain a colored and transparent material, in accordance with an embodiment of the present invention.

FIG. 3 is a flowchart illustrating the steps involved in drying a wet gel to obtain a colored and transparent material in accordance with an embodiment of the present invention. At step 302, the wet gel obtained is dried in a laboratory furnace at temperatures ranging from 50° C. to 100° C. At step 304, the temperature at which the drying is done is maintained until a colored and transparent material is obtained. In an embodiment of the present invention the colored and transparent material is a dry gel.

Figure 4:
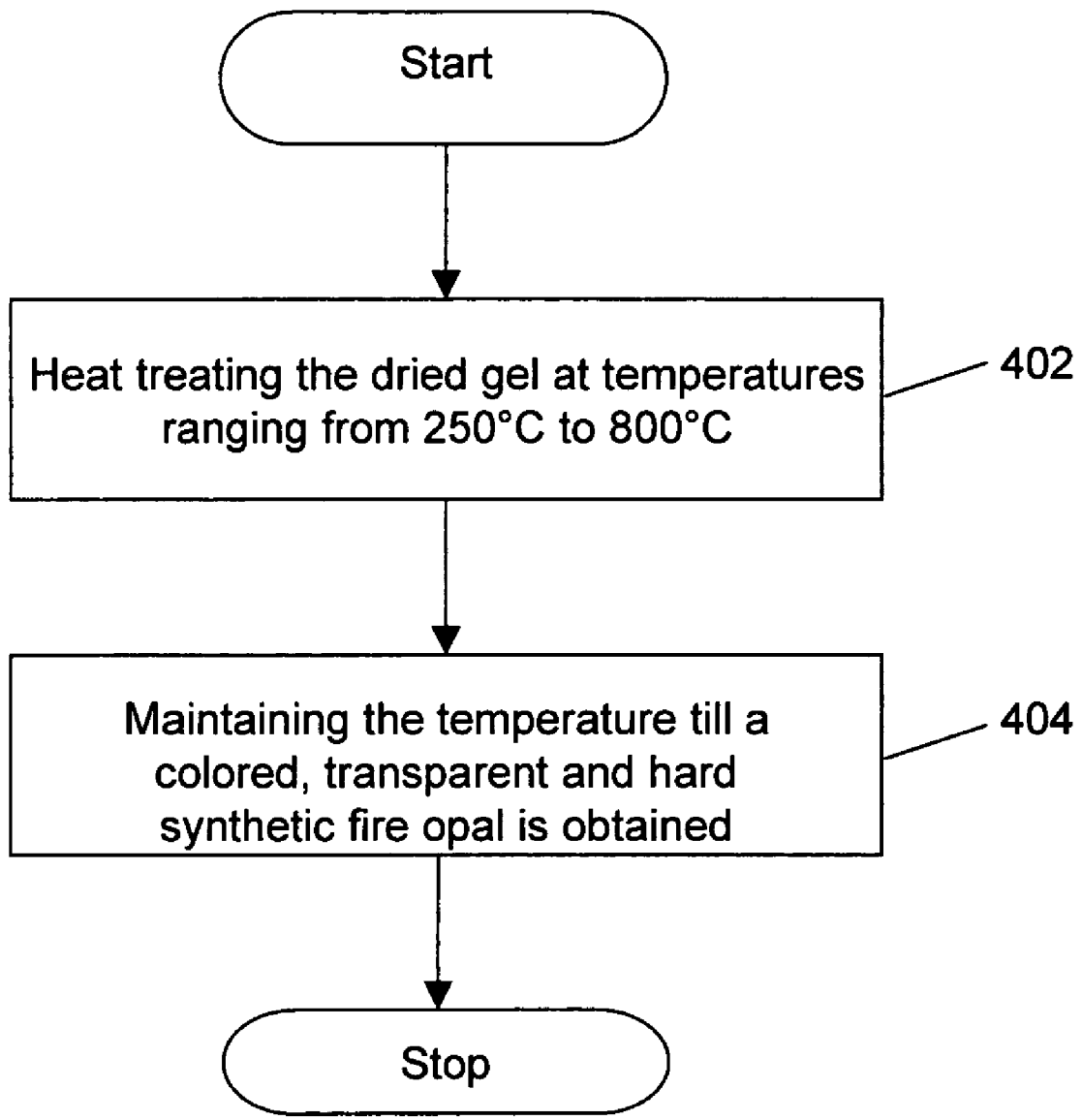
FIG. 4 is a flowchart illustrating the process of sintering the dried gel to obtain a synthetic fire opal, in accordance with an embodiment of the present invention.

FIG. 4 is a flowchart illustrating the steps involved in sintering the dried gel to obtain a synthetic fire opal in accordance with an embodiment of the present invention. At step 402, the colored and transparent material obtained as a result of drying the wet gel (as shown in FIG. 3) is further heat treated at temperatures ranging from 250° C. to 800° C. At this step, the organic part of the colored and transparent material gets removed. Also, at this step, most of the water is removed from the colored and transparent material to prevent crazing. At step 404, the temperature at which the sintering is done is maintained until a colored, transparent and hard synthetic fire opal is obtained. The colored, transparent and hard synthetic fire opal is used in jewelry and ornaments.

In another embodiment of the invention, a synthetic fire opal without any water content is obtained. In the process described above, the colored and transparent material obtained at step 304 is further heat sintered at temperatures beyond 1000° C. to obtain a synthetic fire opal without any water content.

In another embodiment of the invention, the wet gel obtained at step 104 is subjected to supercritical drying in an autoclave to obtain a synthetic fire opal without any water content.

In another embodiment of the invention, a synthetic common opal is obtained. The common opal is translucent to opaque without play-of-color. Further, the synthetic common opal so prepared may be of any color i.e. pink, green, and blue and the like. The synthetic common opal may also be colorless.

Exemplary Embodiment

In an exemplary embodiment of the invention, absolute ethanol (99.9%), distilled water, concentrated nitric acid and salt of iron are mixed in a closed container at room temperature and atmospheric pressure. The mixture is vigorously stirred for 1 to 10 hours using a magnetic stirrer to obtain a homogeneous reaction mixture. TEOS is carefully added to the homogeneous reaction mixture to obtain a clear sol. The mixing and stirring, as described above, results in the hydrolysis of TEOS.

The clear sol obtained after the hydrolysis of TEOS is stored at room temperature in a closed cupboard for a period of 5 to 10 days. After 5 to 10 days, the clear sol is transformed into wet gel, which is used for further processing.

The wet gel thus obtained is dried in a laboratory furnace at temperatures ranging from 50° C. to 100° C. to obtain an orange transparent material.

The orange transparent material obtained as a result of drying the gel is sintered i.e., further heat treated at temperatures ranging from 250° C. to 800° C. During this process organic part of the orange transparent material gets removed and the water content is also reduced to prevent crazing. The final product obtained is an orange, transparent and hard synthetic fire opal for use in jewelry and ornaments.

The orange synthetic fire opal has the same chemical composition and physical properties as a natural fire opal. The synthetic fire opal has the hardness of 5.5 to 6.5 on Mho's scale, water content of at least 2%, refractive index of 1.37 to 1.47 and specific gravity of 1.98 to 2.20 as the natural fire opal. The process for the preparation of the orange synthetic fire opal takes about 4 to 6 weeks. Further, the process for preparation of the orange synthetic fire opal in the present invention is not affected by the particle size of the raw material. The orange synthetic fire opal is more stable and does not show crazing. The orange synthetic fire opal can be used to make beads, cabochons, or cut stones, which can be used in various kinds of jewelry and ornaments.

Exemplary Colors

In another embodiment of the invention, a pink synthetic fire opal is obtained. In the process described above, a salt of cobalt is used in the starting mixture to obtain a pink synthetic fire opal. Usage of a salt of cobalt may also lead to the production of a red synthetic fire opal.

In another embodiment of the invention, a salt of nickel is used in the starting mixture to obtain a green synthetic fire opal.

In another embodiment of the invention, a blue synthetic fire opal is obtained. In the process described above, a salt of copper is used as an inorganic salt in the starting mixture to obtain a blue synthetic fire opal.

In another embodiment of the invention, a salt of iron is used as an inorganic salt in the starting mixture and the sintering of the dried gel is done in an oxidizing atmosphere to obtain an orange synthetic fire opal. Further, in another embodiment of the invention, a yellow synthetic fire opal is obtained by adding an inorganic salt of iron in the starting mixture and sintering the dried gel in nitrogen atmosphere. It will be apparent to a person skilled in the art that in the process described above varying the atmospheric conditions at which the sintering is done may lead to the production of a different colored synthetic fire opal.

In another embodiment of the invention, a colorless synthetic fire opal is obtained. In the process described above, no inorganic salt is used in the starting mixture to obtain a colorless synthetic fire opal.

The synthetic fire opal has the same chemical composition and physical properties as natural fire opal. The synthetic fire opal has the hardness of 5.5 to 6.5 on Mho's scale, water content of at least 2%, refractive index of 1.37 to 1.47, a body color of orange to red tone and specific gravity of 1.98 to 2.20 as the natural fire opal. The synthetic fire opal prepared by the present invention can be obtained in different colors, for example, orange, pink, red, green, yellow and blue and the like. The synthetic fire opal may be colorless also. Further, the synthetic fire opal is transparent. It will be apparent to a person skilled in the art that synthetic fire opal prepared by the disclosed process may be of any size and can be transparent or translucent.

The synthetic fire opal prepared in accordance with an embodiment of the present invention has similar physical and chemical properties as a natural opal. The process for the preparation of the synthetic fire opal takes about 4 to 6 weeks, which is substantially less, compared to already known processes of production of synthetic opals. Further, the process for the preparation of the synthetic fire opal in the present invention is not affected by the particle size of the raw material. There is no requirement for uniform particle size of silica. The present invention leads to the preparation of synthetic fire opal having color uniformity. Further, the synthetic fire opal so prepared may be of any color i.e., orange, pink, red, green, yellow and blue and the like. The synthetic fire opal may also be colorless. The synthetic fire opal is hard and transparent. The synthetic fire opal is more stable and does not show crazing. The synthetic fire opal can be used to make beads, cabochons cut stones or other shapes that can be used in various kinds of jewelry and ornaments.

While various embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention as described in the claims.

What is claimed is:

1. A process for preparing a fire opal for use in jewelry and ornaments, the process comprising the steps of:
   a. mixing at room temperature and atmospheric pressure ethanol, nitric acid, distilled water, and at least one inorganic salt colorant, to obtain a homogeneous reaction mixture;
   b. adding tetraethylorthosilicate (TEOS) to this homogeneous reaction mixture to obtain a clear sol;
   c. gelating the clear sol at room temperature to obtain a gel;
   d. drying the gel at temperatures ranging from 50° C. to 100° C. to obtain a colored and transparent material; and,
   e. sintering the dried gel at temperatures ranging from 250° C. to 800° C. to remove the organic part of the colored and transparent material in order to obtain a uniformly colored, silica matrix which is transparent and hard.

2. The process according to claim 1, wherein the inorganic salt is a salt of iron, the salt of iron being used to obtain an orange synthetic fire opal.

3. The process according to claim 1, wherein the inorganic salt is a salt of cobalt, the salt of cobalt being used to obtain a pink fire opal.

4. The process according to claim 1, wherein the inorganic salt is a salt of cobalt, the salt of cobalt being used to obtain a red fire opal.

5. The process according to claim 1, wherein the inorganic salt is a salt of nickel, the salt of nickel being used to obtain a green fire opal.

6. The process according to claim 1, wherein the inorganic salt is a salt of copper, the salt of copper being used to obtain a blue fire opal.

7. The process according to claim 1, wherein the mixing step is carried out by stirring for 1 to 10 hours to obtain a homogeneous reaction mixture.

8. The process of claim 1, where the step of drying comprises the step of maintaining the drying temperature until a colored and transparent material is obtained.

9. The process according to claim 1, wherein the step of sintering further comprises heat treating the dried gel above 1000° C.

10. The process of claim 1, wherein the step of sintering comprises reducing the water content of the colored and transparent material.

11. A process for preparing a fire opal for use in jewelry and ornaments, the process comprising the steps of:
   a. mixing at room temperature and atmospheric pressure, ethanol, nitric acid, and distilled water and at least one inorganic salt colorant, to obtain a homogeneous reaction mixture;
   b. to this homogeneous reaction mixture adding tetraethylorthosilicate (TEOS) to obtain a clear sol;
   c. gelating the clear sol at room temperature for a time period ranging from 5 to 10 days to obtain a gel wherein the gelatin step comprises the step of storing the clear sol at room temperature;
   d. drying the gel at temperatures ranging from 50° C. to 100° C. in a laboratory furnace to obtain a colored and transparent material; wherein the drying comprises the step of maintaining the temperature for a few hours before cooling; and
   e. sintering the dried gel at temperatures ranging from 250° C. to 800° C. to remove the organic part of the colored and transparent material to obtain a uniformly colored, transparent and hard fire opal; wherein the sintering comprises the step of maintaining the temperature for a few hours before cooling.

12. The process according to claim 11, wherein the step of sintering comprises reducing the water content of the colored and transparent material.

13. A process for preparing a fire opal for use in jewelry and ornaments, the process comprising the steps of:
   a. mixing a precursor for silicon, at room temperature and atmospheric pressure, with a solvent, a catalyst, distilled water, and at least one inorganic salt colorant, to obtain a clear sol;
   b. gelating the clear sol at room temperature to obtain a gel;
   c. drying the gel at temperatures ranging from 50° C. to 100° C. to obtain a colored and transparent material; and
   d. sintering the dried gel at temperatures ranging from 250° C. to 800° C. to obtain a uniformly colored, silica matrix material which is transparent and hard.

14. The process according to claim 13, wherein the precursor for silicon is selected from the group consisting of tetraethylorthosilicate (TEOS), tetramethylorthosilicate ((TMOS), tetramethoxysilane (TMS) and tetraethoxysilane (TES).

15. The process according to claim 13 wherein the solvent is ethanol.

16. The process of claim 13, wherein the catalyst is selected from the group consisting of nitric acid, hydrochloric acid (HCL), ammonia and glacial acetic acid.

17. The process according to claim 13, wherein the inorganic salt is selected from the group consisting of: a salt of iron used to obtain an orange synthetic fire opal; a salt of cobalt used to obtain a pink fire opal; a salt of cobalt used to obtain a red fire opal; a salt of nickel used to obtain a green fire opal; and a salt of copper used to obtain a blue fire opal.

18. The process according to claim 13, wherein the step of sintering further comprises heat treating the dried gel above 1000° C.

19. The process according to claim 13, wherein the step of sintering comprises removing the organic part of the colored and transparent material.

20. The process according to claim 13, wherein the step of sintering comprises reducing the water content of the colored and transparent material.

* * * * *